US012712355B2

(12) United States Patent
Palanche et al.

(10) Patent No.: US 12,712,355 B2
(45) Date of Patent: Aug. 18, 2026

(54) METHOD FOR CHECKING THE ADEQUACY AT THE RESIDUAL CURRENTS OF DIFFERENTIAL CIRCUIT BREAKERS

(71) Applicant: CHAUVIN ARNOUX, Asnieres-sur-Seine (FR)

(72) Inventors: Denis Palanche, Asnieres-sur-Seine (FR); Benoit Pillias, Asnieres-sur-Seine (FR)

(73) Assignee: CHAUVIN ARNOUX, Asnieres-sur-Seine (FR)

(*) Notice: Subject to any disclaimer, the term of this patent is extended or adjusted under 35 U.S.C. 154(b) by 182 days.

(21) Appl. No.: 18/750,172

(22) Filed: Jun. 21, 2024

(65) Prior Publication Data

US 2024/0429701 A1 Dec. 26, 2024

(30) Foreign Application Priority Data

Jun. 22, 2023 (FR) ...................................... 2306448

(51) Int. Cl.
*H02H 3/33* (2006.01)
*G01R 15/18* (2006.01)
*G01R 31/52* (2020.01)

(52) U.S. Cl.
CPC ........... *H02H 3/332* (2013.01); *G01R 15/186* (2013.01); *G01R 31/52* (2020.01)

(58) Field of Classification Search
CPC ........ H02H 3/33; H02H 3/332; G01R 31/327; G01R 31/52; G01R 15/186
See application file for complete search history.

(56) References Cited

U.S. PATENT DOCUMENTS 10,156,591 B2 * 12/2018 Gopfert .............. G01R 1/06788
2013/0191059 A1 * 7/2013 Legros .................. G01R 27/20 702/65

(Continued)

FOREIGN PATENT DOCUMENTS

FR 2206239 A1 6/1974
JP H0657035 U 8/1994

(Continued)

OTHER PUBLICATIONS

French Search Report from corresponding FR Application No. 2306448, Jan. 22, 2024.

*Primary Examiner* — Thienvu V Tran
*Assistant Examiner* — Christopher J Clark
(74) *Attorney, Agent, or Firm* — Workman Nydegger

(57) ABSTRACT

A method is for checking the adequacy of the residual currents passing through a differential circuit breaker disposed at the head of an electrical installation. The method includes acquiring over a total acquisition duration, at a determined sampling frequency, residual current samples during successive acquisition periods; frequency-analyzing by FFT these residual current samples in predetermined frequency bands; determining for each frequency band and for each of the successive acquisition periods, a maximum effective current and, at the end of the total acquisition duration, recording the maximum value of the maximum effective currents; and disqualifying or not the differential circuit breaker depending on whether or not this maximum value of the maximum effective currents meets a predetermined compatibility condition and displaying this disqualification or non-disqualification in binary mode by a pictogram on the leakage current measuring clamp.

10 Claims, 2 Drawing Sheets

(56) References Cited

U.S. PATENT DOCUMENTS

2014/0203799 A1* 7/2014 Legros .................... G01R 1/20
324/126
2023/0090349 A1* 3/2023 Filipetti ................ H02H 3/162
324/509

FOREIGN PATENT DOCUMENTS

JP H0716176 U 3/1995
JP 2006184242 A 7/2006
JP 2009168664 A 7/2009
WO 2021259922 A1 12/2021

* cited by examiner

METHOD FOR CHECKING THE ADEQUACY AT THE RESIDUAL CURRENTS OF DIFFERENTIAL CIRCUIT BREAKERS

TECHNICAL FIELD

The present invention relates to the field of monitoring the electrical appliances and installations by a differential protection consisting in comparing the currents entering and exiting these appliances and installations, in order to ensure the protection of people facing direct electrical contact resulting from a fault in these appliances or installations and it more particularly concerns a method for checking the correct adequacy of this differential protection with the leakage or residual currents emanating from these appliances and installations.

BACKGROUND

The differential protection is implemented in the electrical installations through two families of devices, namely the differential switches and the differential circuit breakers, these by nature very selective (that is to say sensitive but not too much) also integrating the detection of the overcurrents in order to ensure both ground fault and overload protection.

The increasingly widespread use of power electronics in power sources, in their control but also in the powered products has led to the appearance of residual currents of a complex nature and form, with, depending on the case, a direct component, low-frequency but also high-frequency components.

Also, the international standard IEC 60755 and its German equivalent VDE 0664-100 mainly define four families of differential circuit breakers according to the nature of their tripping: the type AC when this tripping is ensured by an alternating current without a direct component, the type A when a pulsed current superimposed on a direct component of at most 6 mA can also ensure this tripping, the type F when this direct component is at most 10 mA and when composite currents can also ensure this tripping and the type B/B+ when a direct current or a high-frequency residual current (possibly greater than 420 mA for the type B+) can also ensure this tripping. By high frequency it is meant a frequency of up to 1 kHz.

In some cases, disturbances resulting from the network or its environment can induce a nuisance tripping of the differential circuit breaker which leads to power supply cuts in the absence of a dangerous situation. This type of tripping, often repetitive, is very detrimental to the quality of energy supply and causes operating losses for the user. These disturbances can also lead to a non-tripping in the presence of a fault and therefore of a danger due to a decrease in sensitivity in the detection of the dangerous fault currents. This situation should not be neglected as it affects safety.

Among the main types of disturbances that can lead to nuisance tripping, we will particularly note:

Permanent leakage currents are higher as the electrical installation is larger. In any electrical installation, there is a ground permanent leakage current due either to imbalances in the natural leakage capacitances of the ground active conductors (three-phase circuits), or to capacitances between a phase and the ground for single-phase circuits which may originate from the filter capacitors connected to the mass of some electronic equipment (automations, communication systems, computer networks, etc.).

Leakage currents with a high-frequency component present in the form of harmonics or transients (resulting for example from turn-on switching) and which can originate from the computer equipment power supplies, the frequency converters, the motor controls by speed variator, the lighting systems with fluorescent lamps. They can also come from the proximity to medium voltage cut-off appliances and capacitor banks for reactive energy compensation.

Among the main types of disturbances that can lead to a non-tripping, there are particularly:

Permanent currents with a direct component as well as permanent currents with a very low-frequency component (typically less than a few Hz). If these currents, by nature, represent low or reduced risks with regard to the protection of people, their ability to saturate the magnetic core which is the active element in the detection of the differential currents, leads to ineffectiveness due to blinding of some differential circuit breakers.

The temperature which can impact the mechanical elements of the circuit breaker.

Thus, to operate in optimal safety conditions without nuisance tripping or non-tripping, the differential circuit breakers must be crossed by residual currents of very specific forms depending on their type (AC, A, F, B/B+).

However, to date, the only existing measuring devices are not capable of simply determining this adequacy. These are indeed either simple portable appliances, of the leakage current clamp type without management of the direct component, or fixed appliances, of the insulation tester type, installed at the head of the electrical installation in which a control signal is injected, or analysis and expertise stations that are particularly complex to use even for an experienced technician.

DISCLOSURE OF THE INVENTION

The object of the invention is therefore to overcome this lack by proposing a method and easy-to-use portable equipment making it possible to analyze the good adequacy of the differential circuit breakers with the residual currents which pass through them in the absence of faults.

These aims are achieved by a method for checking the adequacy at the residual currents of a differential circuit breaker disposed at the head of an electrical installation, by means of a leakage current measuring clamp gripping the active conductors exiting the differential circuit breaker to power a plurality of electrical appliances, the method consisting in:

- acquiring over a total acquisition duration ($t_{end}$-$t_{start}$), at a determined sampling frequency, residual current samples during successive acquisition periods,
- frequency-analyzing by fast Fourier transform (FFT) these residual current samples in predetermined frequency bands,
- determining for each frequency band and for each of the successive acquisition periods, a maximum effective current and, at the end of the total acquisition duration, recording the maximum value of the maximum effective currents thus determined in each frequency band, and
- disqualifying or not the differential circuit breaker depending on whether or not this maximum value of the maximum effective currents meets a predetermined compatibility condition and displaying this disqualification or non-disqualification in binary mode by a pictogram on the leakage current measuring clamp.

Thus, this method implemented by a measuring clamp whose processing module is specially configured for this purpose, can be used in complete safety for the user, requires neither mechanical intervention (dismounting, disconnection, etc.), nor interruption of the energy supply and therefore presents no risk of potential degradation for the electrical installation.

According to one preferred embodiment, the predetermined frequency bands are the following four: DC; DC-50 Hz; 60 Hz-1 kHz; and 1 kHz-10 kHz.

Preferably, the calculation of the FFT is reduced by determining it only up to 1 kHz, the frequency band 1 kHz-10 kHz being calculated by quadratic subtraction between the total effective current obtained over the entire frequency range DC-10 kHz and the sum of the residual current samples obtained in the frequency band DC-1 kHz.

Advantageously, the calculation of the FFT is preceded by a Hanning or Hamming windowing applied to a determined number of residual current samples.

Preferably, the use of a differential circuit breaker of AC, A, or F type which is not recommended is displayed on the leakage current measuring clamp respectively by the pictograms illustrated in Figure CA.

Advantageously, the maximum current value in each of the frequency bands defining the predetermined compatibility condition and leading to the disqualification of the differential circuit breaker is given by the following table:

| DC | DC-50 Hz | 60 Hz-1 kHz | >1 kHz | Displayed pictograms |
|---|---|---|---|---|
| >1 mA and <6 mA | any | any | any | Crossed-out AC pictogram |
| ≥6 mA and <10 mA | any | any | any | Crossed-out AC and A pictograms |
| ≥10 mA | any | any | any | Crossed-out AC, A, and F pictograms |
| any | >1 mA | any | any | Crossed-out AC and A pictograms |
| any | any | >1 mA ≤IΔn | any | Crossed-out AC and A pictograms |
| any | any | >IΔn | any | Crossed-out AC, A, and F pictograms |

Preferably, the total effective current is calculated by simple quadratic addition of all the residual current samples.

Advantageously, the DC current is calculated by averaging the residual current samples.

Preferably, each acquisition period has a fixed duration of 100 ms, the sampling frequency is 81.92 kHz and the determined number of samples for the calculation of the FFT is 512.

The invention also relates to a leakage current measuring clamp including an AC+DC current sensor able to measure AC or DC currents from 1 mA, over a frequency band comprised between 0 Hz and 10 kHz minimum, and a processing module specially configured to implement the aforementioned method.

BRIEF DESCRIPTION OF THE DRAWINGS

Other characteristics and advantages of the present invention will emerge from the description given below, with reference to the appended drawings which illustrate one exemplary embodiment devoid of any limitation and in which.

DESCRIPTION OF THE EMBODIMENTS

The principle of the invention is based on a method for qualifying a standard differential protection of type AC, A, F, B/B+ implemented in an electrical installation, that is to say diagnosing or highlighting in this installation devoid of faults, an inadequacy of this differential protection with regard to the residual currents present in this installation.

This checking method consists, by gripping all the active conductors at the head of a differential circuit breaker, in identifying the differential circuit breakers not compatible with the measured residual currents and in providing, in the form of a pictogram, a simple binary indicator, an inadequacy (or non-compatibility) verdict of the installed differential protection. It will also be able to integrate the visualization of the main causes of inadequacy observed and/or measured.

Figure 1:
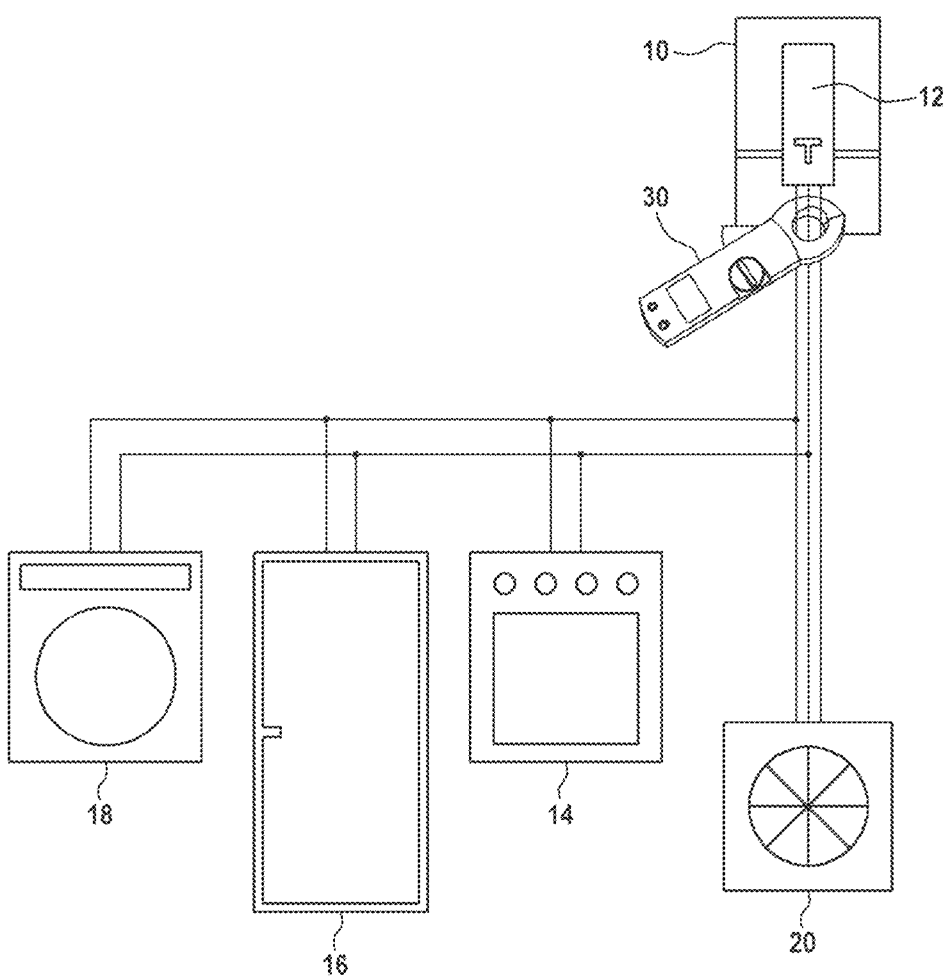
FIG. 1 illustrates a schematic example of a household electrical installation to which the method for checking differential circuit breakers according to the invention is applied.

FIG. 1 shows one example of a household electrical installation whose electrical panel 10 includes a differential circuit breaker 12 to be tested.

The differential circuit breaker is connected to various electrical appliances for which it ensures protection, for example: an electric oven 14, a refrigerator 16, a washing machine 18 all single-phase supplied and a three-phase supplied inverter heat pump 20. The installation is assumed to be in operation and without defects as mentioned previously (the invention has no meaning in a defective installation).

According to the invention, the method for checking the adequacy of this differential circuit breaker 12 at the residual currents passing therethrough is implemented in this installation by means of a measuring device 30 gripping all of the active conductors (phase(s)) +neutral) connected at the output of the differential circuit breaker. Such a measuring device is for example a leakage current measuring clamp as described in the Application FR2206239 filed in the name of the Applicant, including an AC+DC leakage current sensor able to accurately measure AC or DC currents from 1 mA, on a frequency band comprised between 0 Hz and 10 kHz minimum, whose measurement processing module is specially configured to implement this innovative method.

Figure 2:
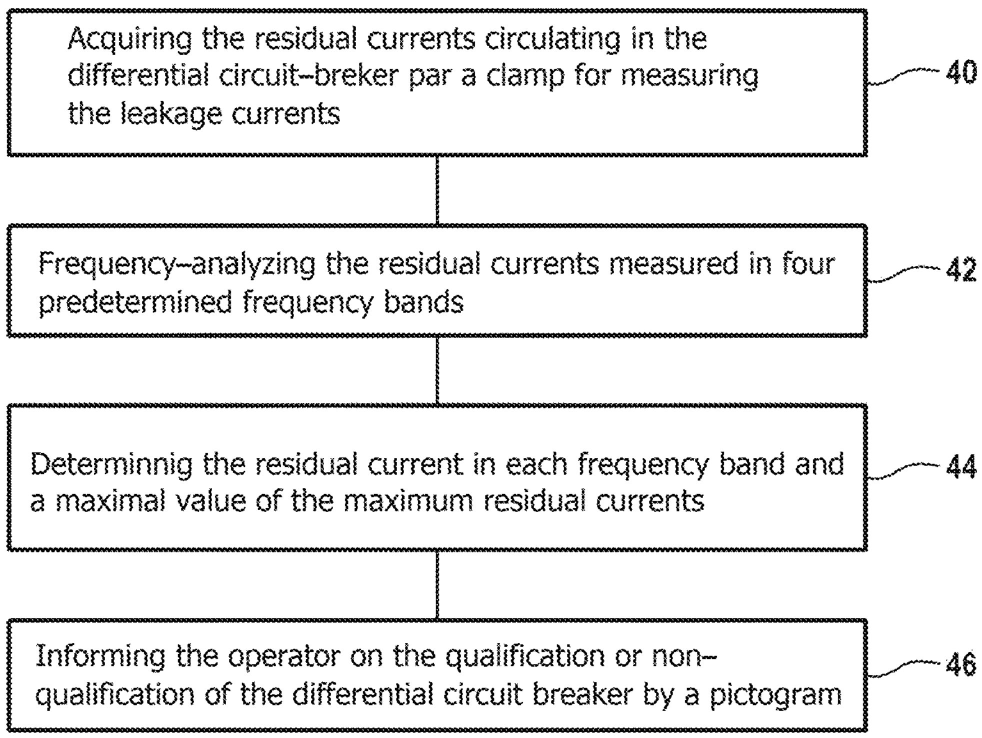
FIG. 2 shows the different steps of the method for checking differential circuit breakers according to the invention.

The different steps of this method are illustrated in FIG. 2.

Once the measuring clamp 30 has been placed by the operator so as to grip all the active conductors (phase(s)+neutral) exiting the differential circuit breaker 12, the first step 40 of the method consists in carrying out over a total acquisition duration set by the operator (as will be detailed below) successive acquisitions, for example per period of 100 ms, of the residual current present in the installation and circulating in this differential circuit breaker.

In a second step 42, the measured residual currents are subject to a frequency analysis in four predetermined frequency bands: DC; DC-50 Hz; 60 Hz-1 kHz; and 1 kHz-10 kHz. DC meaning the frequency 0 Hz and the open or closed brackets meaning respectively an exclusion or an inclusion of the boundary frequency of the associated frequency range.

Then, in a following step 44, for each acquisition period and in each frequency band, a maximum effective current ($Imax_{DC}$, $Imax_{DC\text{-}50Hz}$, $Imax_{60\ Hz\text{-}1kHz}$, $Imax_{1kHz\text{-}10kHz}$) corresponding to the maximum value of the residual currents measured in a determined frequency band and for a determined acquisition period, is calculated and recorded in memory. At the end of the total acquisition duration, the maximum value (maximum maximorum) of these maximum effective currents is recorded in turn.

Finally, in a fourth and last step 46, this maximum value of the maximum effective currents obtained in each frequency band is used as a compatibility condition to segregate the different types of differential circuit breakers in accordance with the aforementioned standards and therefore disqualify a particular circuit breaker by informing the operator with a simple binary signal which can be typically indicated by a pictogram or an icon. However, in order not to keep the operator waiting if, for example, it is already known that the AC circuit breaker is not compatible, it is possible to carry out this segregation step and the pictogram display step which will be detailed further at the same time as the calculation of the maximum of maximums, that is to say in particular every 100 ms.

To avoid a problem of blinding on some differential circuit breakers in the presence of current >1 kHz, it is also possible to inform the operator about the value of the current in this band and, if this current is significant, to recommend that he not use the AC type circuit breaker.

The total duration of acquisition of the measurements ($t_{end}$-$t_{start}$) and therefore of the corresponding frequency analysis depends on the nature of the charges connected to the differential circuit breaker 12. It is up to the operator to estimate this duration because it is he who has knowledge of the nature of the charges connected to the differential circuit breaker. The objective is to be able to record all the operating modes of the appliances. Some illustrative examples are given in the table below:

| Type of charge | Total acquisition duration |
|---|---|
| Home automation charge (computer, luminaire, roller shutter . . . ) | <1 minute |
| Compressor system: Refrigerator, freezer Older generation PAC | 10 minutes |
| Variable-frequency driven system: Next generation PAC with inverter Next generation refrigerator with inverter Steam oven with inverter Car battery charger | <1 minute |
| Electrical appliances Washing machine | 60 minutes |

The first step of acquiring the current measurements is more specifically detailed below.

The analog signals derived from the current sensor are sampled using an analog-to-digital converter in the measuring clamp processing module. The sampling frequency should be set so as to be able to acquire the highest frequency. For example, to accurately measure the 10 kHz, a sampling frequency of at least 50 kHz should be chosen. Likewise, the duration of the acquisition must at least be greater than one period of the electrical network (i.e. 20 ms for the 50 Hz and 16.66 ms for the 60 Hz). This duration can be variable depending on the network period measured, but it is preferably fixed for reasons of simplicity and robustness. Typically, a fixed duration equal to 100 ms is preferred because it represents an integer number of periods for both the 50 Hz (5 periods) and the 60 Hz (6 periods). Thus, a sampling at 50 kHz would allow collecting 5,000 measurement samples out of 100 ms.

Figure 3:
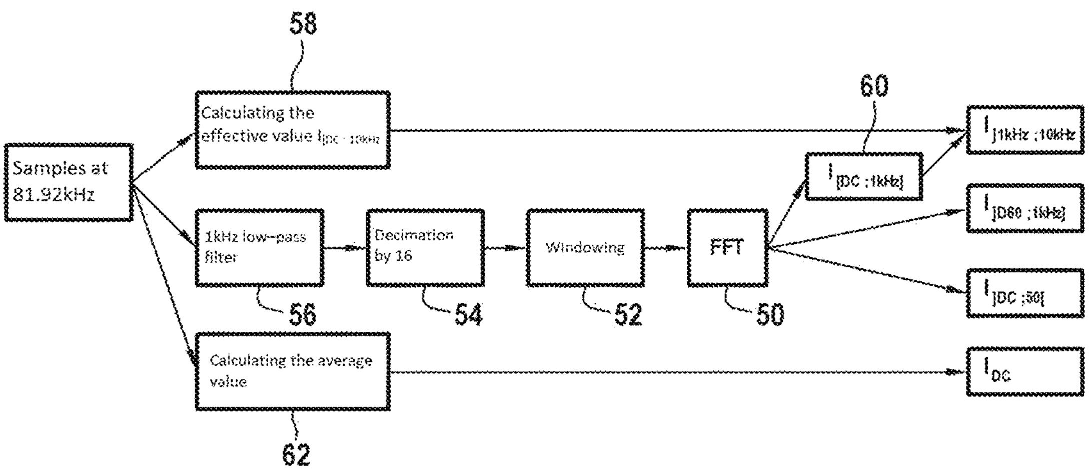
FIG. 3 shows in detail the step of frequency-analyzing by FFT the residual currents of the method in FIG. 2.

The second frequency analysis step is now detailed with reference to FIG. 3. This is carried out by a Fast Fournier Transform (FFT) algorithm 50 which requires, for correct operation, a number of samples multiple of $n=2^p$. The sampling frequency is therefore preferably chosen at 81.92 kHz thus making it possible to obtain 8,192 samples of the residual current ($n=2^{13}$) over the period of 100 ms.

A windowing 52, of the Hanning or Hamming type for example, precedes the calculation of the FFT in order to obtain a smoother result of the FFT. The duration of the calculation depends on the number of samples and is proportional to n.log(n). The memory of the processing module needed for this calculation is also proportional to n. Also, to reduce the size of the memory necessary for storing the samples and save calculation time, it is chosen to perform this calculation of the FFT only up to 1Khz (block 56 of low-pass filtering) and also not to take that 1 sample out of 16 (decimation block 54) is only 512 samples out of the 8,192 collected.

Given that the calculation of the FFT must only relate to four frequency bands, this simplification of the calculation by the decimation module 54 and the use of low-pass filtering 56 determining the FFT only up to 1 kHz, makes it possible to calculate the frequency band 1 kHz-10 kHz by quadratic subtraction between the total effective current (calculation block 58) obtained over the entire frequency range DC-10 kHz and the sum of the samples of the FFT (calculation block 60) obtained in the frequency band DC-1 kHz. The total effective current is calculated by simple quadratic addition of all the samples. The DC current is also obtained from the FFT but can be calculated more accurately by averaging the samples (calculation block 62).

This innovative technique makes it possible to reduce the calculation time of the FFT by approximately 23 (to the initial saving in calculation time of the FFT of 170 due to decimation, it is necessary to add the calculation of the low-pass filter at 1 kHz and the quadratic subtraction that reduces this ratio to approximately 23) and therefore, as indicated previously, to reduce the size of the memory by 16.

The last step of the method allowing the information to the operator on the disqualification or non-disqualification of the tested differential circuit breaker is detailed below. Indeed, the calculation of the maximum value of the maximum effective currents in the four frequency bands allows, depending on its level, segregating the 4 types of differential circuit breaker according, for example, to the IEC 60755 standard (AC/A/F/B).

Figure 1A:
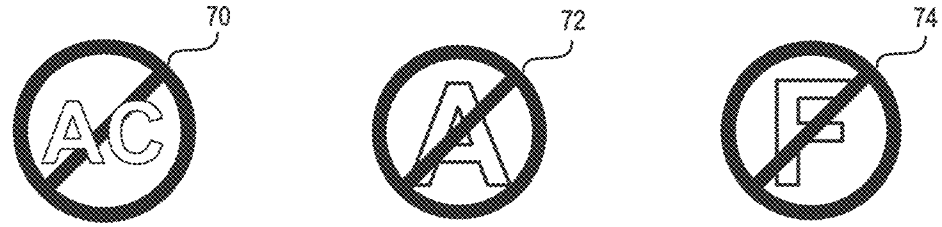
FIG. 1A illustrates pictograms that can be displayed in a binary or on/off mode by the measuring clamp.

For this, and thus for simplifying the analysis result for the operator, the pictograms illustrated in FIG. 1A can be displayed in a binary or on/off mode:

- Crossed-out AC pictogram (70): the use of AC type differential circuit breaker is not recommended
- Crossed-out A pictogram (72): the use of A type differential circuit breaker is not recommended
- Crossed-out F pictogram (74): the use of F type differential circuit breaker is not recommended The table below sets the maximum current value in each frequency band leading to the disqualification of some differential circuit breakers:

| DC | DC-50 Hz | 60 Hz-1 kHz | >1 kHz | Displayed pictograms |
|---|---|---|---|---|
| >1 mA and <6 mA | XXX | XXX | XXX | Crossed-out AC pictogram (70) |
| >6 mA and <10 mA | XXX | XXX | XXX | Crossed-out AC and A pictograms (70, 72) |
| ≥10 mA | XXX | XXX | XXX | Crossed-out AC, A, and F pictograms (70, 72, 74) |
| XXX | >1 mA | XXX | XXX | Crossed-out AC and A pictograms (70, 72) |
| XXX | XXX | >1 mA ≤IΔn | XXX | Crossed-out AC and A pictograms (70, 72) |
| XXX | XXX | >IΔn | XXX | Crossed-out AC, A, and F pictograms (70, 72, 74) |

XXX = any and IΔn an uncertainty

A threshold exceeded on the DC current leads to a potential safety problem with the blinding and the non-tripping of the differential protection in the event of an insulation fault, A threshold exceeded on the frequency bands DC-50 Hz and 60 Hz-1 kHz does not result in a safety risk but in unwanted potential tripping, Too high a current in the band >1 kHz can lead to a potential safety problem on the differential circuit breakers with the blinding and the non-tripping of the differential protection in the event of an insulation fault.

It will be noted that, if in the aforementioned example, the frequency band greater than 1 kHz is not used for the selection of the differential circuit breakers, nothing prevents it from doing so if the need arises, in particular in the context of the VDE 0664-100 standard or any other to come.

The invention claimed is:

1. A method for checking adequacy at residual currents passing through a differential circuit breaker disposed at a head of an electrical installation, by means of a leakage current measuring clamp gripping active conductors exiting the differential circuit breaker to power a plurality of electrical appliances, the method comprising in:

acquiring over a total acquisition duration ($t_{end}$-$t_{dstart}$), at a determined sampling frequency, residual current samples during successive acquisition periods, frequency-analyzing by fast Fourier transform (FFT) the residual current samples in predetermined frequency bands, determining for each frequency band of each acquisition period, a maximum effective current and, at an end of the total acquisition duration, recording a maximum value of maximum effective currents determined in each band frequency, and disqualifying or not the differential circuit breaker depending on whether or not this maximum value of the maximum effective currents meets a predetermined compatibility condition and displaying this disqualification or non-disqualification in binary mode by a pictogram on the leakage current measuring clamp.

2. The method according to claim 1, wherein the predetermined frequency bands are the following four: DC; DC-50 Hz; 60 Hz-1 kHz; and 1 kHz-10 kHz.

3. The method according to claim 2, wherein calculation of the FFT is reduced by determining it only up to 1 kHz, the frequency band 1 kHz-10 kHz being calculated by quadratic subtraction between a total effective current obtained over an entire frequency range of DC-10 kHz and a sum of the residual current samples obtained in the frequency band DC-1 kHz.

4. The method according to claim 3, wherein the calculation of the FFT is preceded by a Hanning or Hamming windowing applied to a determined number of residual current samples.

5. The method according to claim 1, wherein use of a differential circuit breaker of the AC, A, or F type which is not recommended is displayed on the leakage current measuring clamp respectively by at least one of the following pictograms:

a crossed-out AC pictogram;

a crossed-out A pictogram; and a crossed-out F pictogram.

6. The method according to claim 4, wherein the maximum current value in each of the frequency bands defining the predetermined compatibility condition and leading to the disqualification of the differential circuit breaker is given by the following table:

| DC | DC-50 Hz | 60 Hz-1 kHz | >1 kHz | Displayed pictograms |
|---|---|---|---|---|
| >1 mA and <6 mA | any | any | any | a crossed-out AC pictogram |
| ≥6 mA and <10 mA | any | any | any | crossed-out AC and A pictograms |
| ≥10 mA | any | any | any | crossed-out AC, A, and F pictograms |
| any | >1 mA | any | any | crossed-out AC and A pictograms |
| any | any | >1 mA ≤IΔn | any | crossed-out AC and A pictograms |
| any | any | >IΔn | any | crossed-out AC, A, and F pictograms. |

7. The method according to claim 3, wherein the total effective current is calculated by simple quadratic addition of all the residual current samples.

8. The method according to claim 1, wherein DC current is calculated by averaging the residual current samples.

9. The method according to claim 1, wherein each of the successive acquisition periods has a fixed duration of 100 ms, the sampling frequency is 81.92kHz and a determined number of samples for calculation of the FFT is 512.

10. A leakage current measuring clamp including an AC+DC current sensor able to measure AC or DC currents from 1 mA, over a frequency band comprised between O Hz and 10 kHz minimum, and a processing module specially configured to implement the method according to claim 1.

* * * * *